(12) United States Patent
Meany (10) Patent No.: US 7,484,148 B2
(45) Date of Patent: Jan. 27, 2009

(54) INTERFACE ERROR MONITOR SYSTEM AND METHOD

(75) Inventor: Thomas J. Meany, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 940 days.

(21) Appl. No.: 10/316,549

(22) Filed: Dec. 11, 2002

(65) Prior Publication Data

US 2004/0117702 A1 Jun. 17, 2004

(51) Int. Cl.
*G01R 31/28* (2006.01)

(52) U.S. Cl. .................. 714/726; 714/732; 714/718; 714/744; 714/799; 714/742

(58) Field of Classification Search .......... 714/726, 714/718, 44, 52, 732, 744, 799, 742
See application file for complete search history.

(56) References Cited

U.S. PATENT DOCUMENTS 4,513,418 A * 4/1985 Bardell et al. ............. 714/726
4,980,888 A * 12/1990 Bruce et al. ............... 714/718
5,778,206 A * 7/1998 Pain et al. .................. 710/305
5,905,738 A * 5/1999 Whetsel .................... 714/732
6,049,894 A * 4/2000 Gates ........................ 714/41
6,189,127 B1 * 2/2001 Fang et al. ................. 714/799
6,671,832 B1 * 12/2003 Apisdorf .................... 714/52
6,691,272 B2 * 2/2004 Azim ........................ 714/744
6,771,442 B2 * 8/2004 Bliss et al. ................. 360/39

* cited by examiner

*Primary Examiner*—Guy J Lamarre
*Assistant Examiner*—Fritz Alphonse
(74) *Attorney, Agent, or Firm*—Iandiorio Teska & Coleman (57) ABSTRACT

An interface error monitor system for monitoring data exchanged between a controller and a data converter over an interface includes a multi-stage linear feedback shifter register associated with the data converter for generating a pseudo random number sequence; a signature generating circuit responsive to data exchanged between the controller and data converter for altering the pseudo random number sequence generated by the linear feedback shifter register to create a signature of the data.

23 Claims, 6 Drawing Sheets

INTERFACE ERROR MONITOR SYSTEM AND METHOD

FIELD OF THE INVENTION

This invention relates to an interface error monitor system and method for monitoring data exchanged between a controller and a data converter such as an analog to digital converter or digital to analog converter.

BACKGROUND OF THE INVENTION

Data converters both analog to digital converters (ADC's) and digital to analog converters (DAC's) often are used in harsh industrial environments such as data acquisition and transfer applications where noise is a serious problem causing errors in the data exchanged between the controller and the data converted. One approach is to reduce the noise to levels where no or very few errors occur using optoisolators, differential signals and hysteresis techniques but these are expensive and space consuming solutions which still can't assure noise free and error free data exchanges. In one technique for detecting errors in the data exchange the data is simply read a second or third time. This severely reduces the data transfer rate or requires faster more expensive systems to maintain the original data transfer rate. Conventional error checking approaches could be used but they require additional and costly error checking logic and/or parity bits which increase the size of the data and processing time. See generally The Ouroboros of the digital consciousness: Linear-feedback-shift registers. EDN Jan. 4, 1996; Digital systems testing and testable design. Pages 431 to 448. ISBN 0-7803-1062-4; and Bebop to the Boolean logic. ISBN 1878707-22-1. Appendix F.

BRIEF SUMMARY OF THE INVENTION

It is therefore an object of this invention to provide improved interface error monitor system and method for monitoring data exchanged between a controller and data converter.

It is a further object of this invention to provide such an improved interface error monitor system and method for monitoring data exchanged between a controller and data converter which requires little additional circuitry and chip space.

It is a further object of this invention to provide improved interface error monitor system and method for monitoring data exchanged between a controller and data converter which avoids using additional parity bits.

It is a further object of this invention to provide improved interface error monitor system and method for monitoring data exchanged between a controller and data converter which reduces the amount of data transferred for error checking.

It is a further object of this invention to provide improved interface error monitor system and method for monitoring data exchanged between a controller and data converter which inherently functions with any size data exchange.

It is a further object of this invention to provide improved interface error monitor system and method for monitoring data exchanged between a controller and data converter which enables user control over the timing and frequency of error checking.

This invention features an interface error monitor system for monitoring data exchanged between a controller and a data converter including a multi-stage linear feedback shift register associated with the data converter for generating a pseudo random number sequence. A signature generating circuit responsive to the data exchanged between the controller and data converter alters the pseudo random number sequence generated by the linear shift feedback register to create a signature of the data.

In a preferred embodiment, a replicating system associated with the controller may be responsive to the data exchanged for creating an image of the signature of the data created by the linear feedback shift register. An error detecting system may be responsive to a mismatch between the signature of the data and the image of the signature of the data to indicate an error in the data exchange. The linear feedback shift register may include at least sixteen stages. The data exchange may include multi bit words and the signature generating circuit may include a logic gate for each bit of a word in the data exchanged. Each logic gate may be interposed between a different pair of stages. The replicating system may include a second linear feedback shifter register. The error detecting system may include a comparator; the data exchanged may include data in and data out. There may be a switching circuit for selectively connecting the linear feedback shifter register to data in and data out. There may be a second linear feedback shifter register associated with the data converter; one of the feedback registers may be responsive to the data in and the other responsive to the data out. The data converter may be an analog to digital converter or it may be a digital to analog converter. The linear feedback shift register may be reset by a sequence of data bits in the data exchanged. The switching circuit may re responsive to whether data in or data out is active.

The invention also features an interface monitor system for monitoring data exchanged between a controller and a data converter over an interface. There is a multistage linear feedback shift register associated with the data converter for generating a pseudo random number sequence. A signature generating circuit responsive to data exchanged between the controller and data converter alters the pseudo random number sequence generated by the linear feedback shift register to create a signature of the data. The data exchanged includes a first data signal and there is a clock for providing synchronizing clock signals between the controller and the data converter.

In a preferred embodiment, the data exchange may further include a second data signal. There may be a switching circuit for selectively connecting the linear feedback shift register to first and second data signals. There may be a second linear feedback shift register associated with the data converter one of the feedback registers being responsive to the first data signal and the other being responsive to the second data signal.

The invention also features an interface error monitor system for monitoring data exchanged between the controller and the data converter over an interface including a multistage linear feedback shift register associated with the data converter for generating a pseudo random number sequence. A signature generating circuit is responsive to data exchanged between the controller and data converter for altering the pseudo random number sequence generated by the linear feedback shift register to create a signature of the data wherein the contents of the multistage linear feedback register is read from the data converter over the interface.

This invention also features an interface error monitoring method for monitoring the data exchange between a controller and a data converter over an interface including setting a signature in the data converter and setting a signature in the controller. The method further includes altering, in response to data exchanged between the controller and the data converter, the pseudo random number sequence generated by a linear feedback shift register in each of the data converter and controller to generate a new signal in each of the data converter and controller. Data is communicated between the controller and the data converter and the new signatures from the data converter and controller are read over the interface. The new signatures are compared, and if they match, the communication is validated.

The invention results from the realization that an improved interface error monitor system and method for monitoring data exchanged between a controller and a data converter which achieves all of the foregoing objects can be achieved by altering with the data exchanged a pseudo random number sequence generated in the data converter to construct a signature of that exchanged data and then comparing that signature with an image of that signature constructed by a replicating circuit in the controller.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

Figure 1:
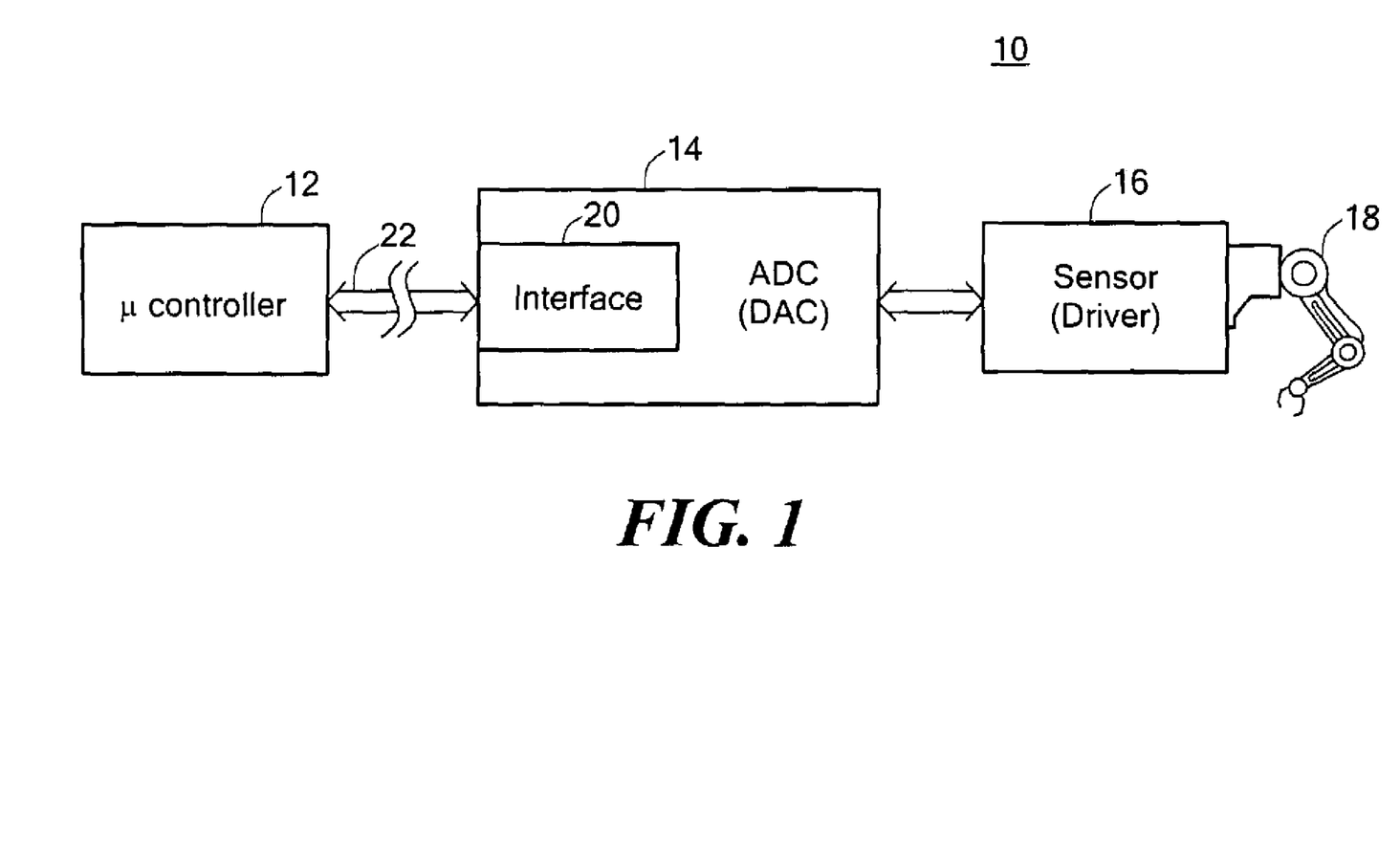
FIG. 1 is a schematic block diagram of an industrial data converter that employs this invention.

There is shown in FIG. 1 an industrial data converter system 10 including a micro-controller 12, data converter 14, sensor 16, and typically some device such as robot arm 18. Data converter 14 maybe an analog to digital converter or a digital to analog converter. If it is an analog to digital converter analog signals received from sensor 16 indicating for example the position, acceleration or velocity of arm 18 are converted to digital signals and through interface 20 are delivered over bus 22 to micro-controller 12. In the event that data converter 14 is a digital to analog converter then micro-controller 12 may send digital signals over bus 22 to interface 20 where digital to analog converter converts them to analog signals to operate driver 16 to control the velocity, acceleration or position of arm 18.

Figure 2:
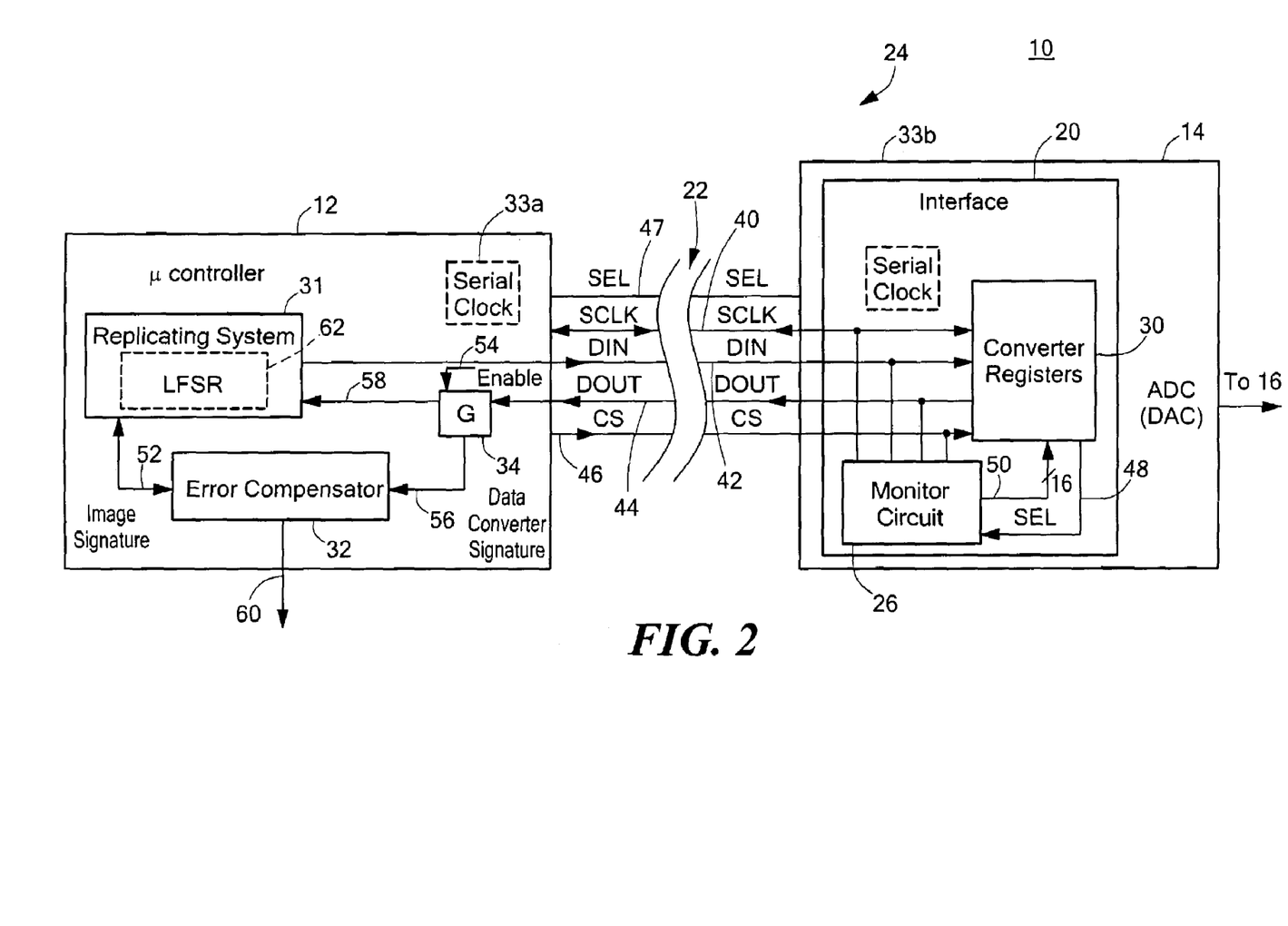
FIG. 2 is a more detailed schematic block diagram of the microcontroller and interface of FIG. 1.

Error monitor system 24, FIG. 2, according to this invention includes monitor circuit 26 in interface 20, which also includes the converter registers 30 associated with the analog to digital converter or digital to analog converter 14. In microcontroller 12 portions of error monitor system 24 include replicating system 31 error comparator 32 and logic gate 34. Serial interface bus 22 includes SCLK line 40 which provides synchronizing clock signals to both micro-controller 12 and data converter 14 and may originate in either serial clock 33a in controller 12 or serial clock 33b in DAC14. A first data signal is supplied to data converter 14 from micro-controller 12 over data in line DIN 42 while a second data signal, data out from data converter 14 is provided to micro-controller 12 on DOUT line 44. Chip select signal CS is provided on line 46 to alert data converter 14 that the data on the DIN line 42 is meant for it or to provoke it to issue its data out on DOUT line 44. Converter registers 30 consist of registers of various lengths which default to reasonable values after reset and which maybe written to by micro-controller 12 to control the performance of data converter 14. Registers 30 will in general allow reading as well as writing so that their contents may be verified over the interface. Select signal SEL controls what signal DIN or DOUT will be submitted as the monitor signal MIN in the embodiment of FIG. 3.

In operation with the clock signal SCLK occurring on line 40, FIG. 2, and CS line 46 enabled, data converter 14 is alerted through converter register 30 and monitor circuit 26 that it is on-line and should either put its data out on DOUT line 44 or be prepared to receive data in on DIN line 42. In some arrangements data converter 14 is internally aware of its status as to receiving or outputting data and can supply a select signal directly, internally from converter registers 30 over line 48 to monitor circuit 26. The SEL signal can also be internally generated within controller 62 and data converter 14 without need for line 48 if both controller 62 and data converter 14 use the same rules to generate the sequence. Monitor circuit 26 is connected typically by sixteen bit lines 50 to converter registers 30 so that it appears as just another register among the converter registers 30. When the data exchange starts, for example by the receipt of data in on DIN line 42, monitor circuit 26 which may include a pseudo random number generator, monitors the data and creates a signature representative of that data. The signature is created by altering the generation of the pseudo random number sequence as a function of the data being exchanged over bus 22; in this case the data in on DIN line 42. The data exchange over DIN line 42 also causes replicating system 31 in microcontroller 12 to generate an image signature also using a pseudo random number sequence which it provides on line 52. At this time the signature created by monitor circuit 26 is delivered on line DOUT 44 to logic gate 34. Micro-controller 12 provides an enable signal on line 54 to enable gate 34 to pass the signature signal on DOUT line 44 over line 56 directly to error comparator 32 instead of over line 58 to the replicating system 31. Error comparator 32 compares the data converter signature from data converter 14 which appears on line 56 with the image signature created in replicating system 31 which appears on line 52. If there is any difference between the two, an error indication is provided on line 60 or other suitable indications or signals can be generated. Replicating system 31 may use a linear feedback shift register 62 to generate the image signature from a pseudo random numbering sequence or the function of a linear feedback shifter register maybe effected in software by using code such as the following code:

```
main( ){
    int data,q[16],qq[16],I,j;
    for (i=0;i<=15;i++) q[i]=1;
    while (1){
        scanf("%d",&data);
        if (data==q[15])qq[0]=0;
        else qq[0]=1;
        qq[1]=q[0];
        if (q[1]==q[15]) qq[2]=0;
        else qq[2]=1
        if (q[2]==q[15]) qq[3]=0;
        else qq[3]=1;
        qq[4]=q[3];
        if (q[4]==q[15]) qq[5]=0;
        else qq[5]=1;
        qq[6]=q[5];/* */
        qq[7]=q[6];
        qq[8]=q[7];
        qq[9]=q[8];/* */
        qq[10]=q[9];
        qq[11]=q[10];
        qq[12]=q[11];
        qq[13]=q[12];
        qq[14]=q[13];
        qq[15]=q[14];
        for (i=15;i>=0;i--){
            q[i]=qq[i];
            printf("%1d",q[i]);
            if ((i%4)==0) printf(" ");
        }
        printf("\n");
    }
}
```

Figure 8:
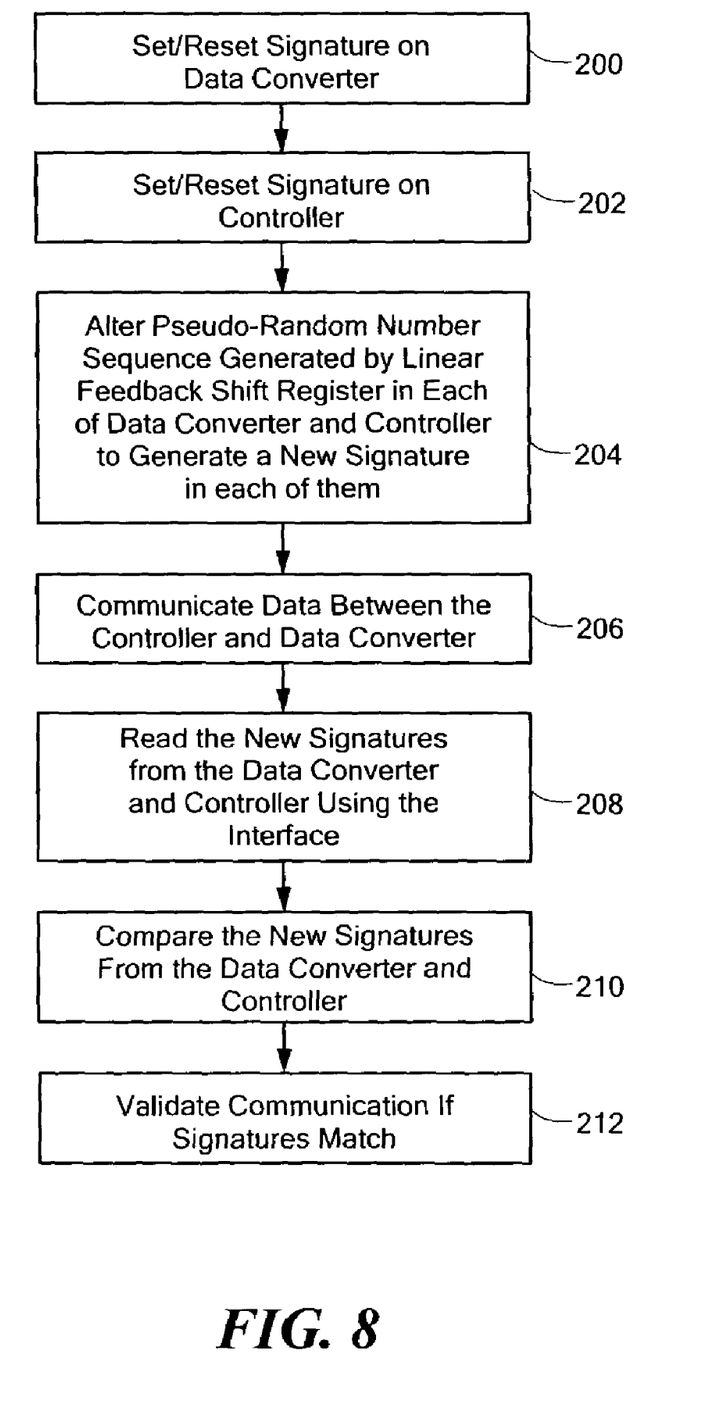
FIG. 8 is a flow chart of the method according to this invention.

One example of this method according to the invention includes setting or resetting the signature on the data converter, step 200, FIG. 8, and resetting or setting the signature on the controller, step 202. After that, the pseudo random number sequence generated by the linear feedback shift register in each of the data converter and the controller is altered to generate a new signature in each of the data converter and controller, step 204. Following communication of data between the controller and data converter, step 206, the new signatures are read, step 208, from the data converter and the data controller over the interface. The new signatures for the data converter and the controller are compared, step 210, and the communication is validated if the signatures match, step 212.

Figure 3:
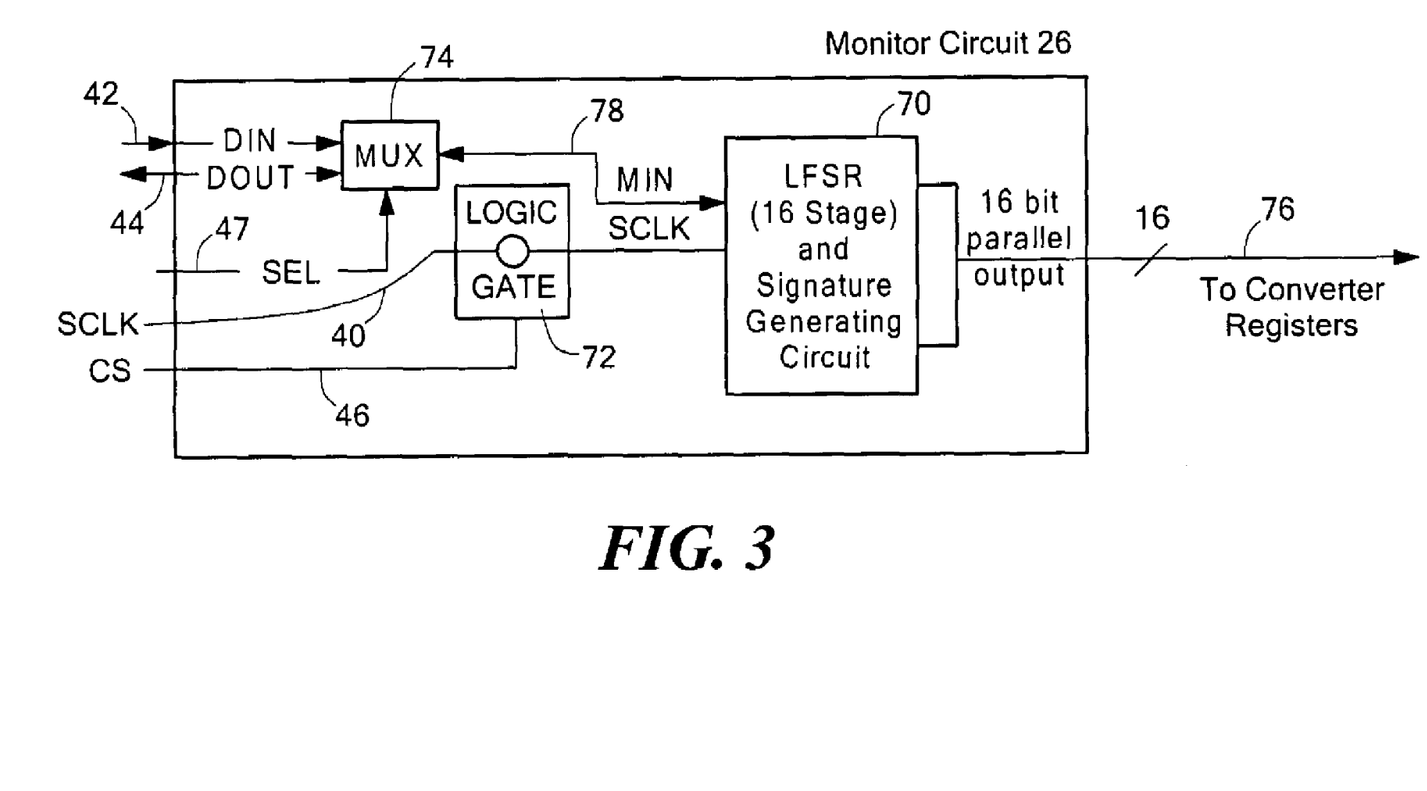
FIG. 3 is a more detailed block diagram of the monitor circuit of FIG. 2.
Figure 5:
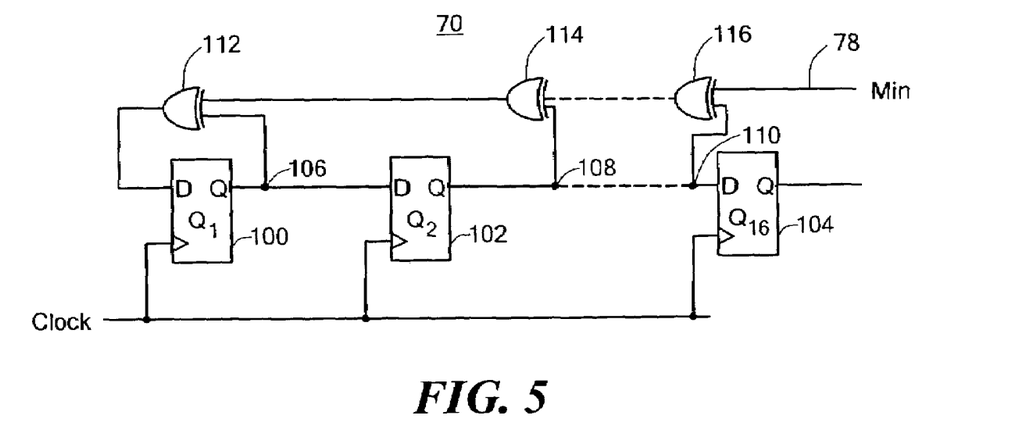
FIG. 5 is a more detailed schematic of the linear feedback shift register of FIG. 3.

Monitor circuit 26, FIG. 3, may include a linear feedback shift register 70, logic gate 72 and switching circuit mux 74. Linear feedback shift register 70 may be a sixteen stage register and includes a signature generating circuit explained in more detail here-in-after with respect to FIG. 5. The output of linear feedback shift register 70, which amounts to the signature signal, is delivered on line 76 to converter registers 30 which then deliver it on line DOUT 44 to logic gate 44 in micro-controller 12 in FIG. 2. Mux 74, FIG. 3, receives the data input on line DIN 42 and provides data on DOUT line 44. The data whatever its source, DIN or DOUT, becomes the monitor in signal MIN to the linear feedback shift register 70. The select signal on SEL line 47 determines which input DIN 42 or DOUT 44 mux 74 will choose as the MIN input 78 to linear feedback shift register 70. For example, when SEL line 47 is high DOUT is connected to MIN line 78, whereas when SEL line 47 is low DIN is connected to MIN line 78. Logic gate 72 functions to provide SCLK, the clock signal, on SCLK line 40 to linear feedback shift register 70 when the chip select signal on CS line 46 indicates that this is the one of all the available data converters that is being addressed at this time. It should be noted that the linear register can be reset by a sequence of bits in the data exchanged. The switching circuit may be switched in response to whether data in or data out is active.

Figure 4:
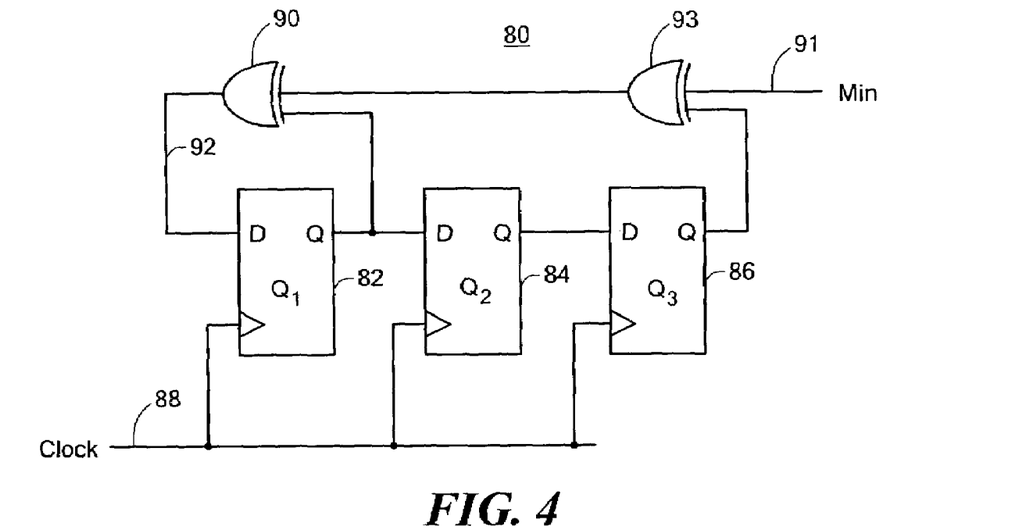
FIG. 4 is a schematic diagram of a three-stage linear feedback shift register (LFSR) functioning as a pseudo random number generator.

A linear feedback shift register (LSFR) is basically a shift register with feedback to pre-defined taps. Such an LFSR 80 is shown in FIG. 4 including three D-type flip flops, Q1 82, Q2 84, and Q3 86 operated by a common clock on line 88 and with feedback from the output of the first stage 82 and the last stage 86 combined through exclusive or gate 90 and delivered on line 92 to the input of the first stage 82. The other input to exclusive or gate 90 is from exclusive or gate 93 which has as its inputs MIN line 91 and the Q output of flip flop Q3 86. The output sequence starting from a state of all ones with MIN=0 is shown in Table I:

TABLE I

|  | Q1 | Q2 | Q3 | Output in decimal | D1 |
|---|---|---|---|---|---|
| Start | 1 | 1 | 1 | 7 | 0 |
| After 1 clock | 0 | 1 | 1 | 3 | 1 |
| After 2 clocks | 1 | 0 | 1 | 5 | 0 |
| After 3 clocks | 0 | 1 | 0 | 2 | 0 |
| After 4 clocks | 0 | 0 | 1 | 1 | 1 |
| After 5 clocks | 1 | 0 | 0 | 4 | 1 |
| After 6 clocks | 1 | 1 | 0 | 6 | 1 |
| After 7 clocks | 1 | 1 | 1 | 7 | 0 |
| Back to start |  |  |  |  |  |

After seven clocks the LFSR returns to its initial condition and will thereafter repeat the same sequence as it is further clocked. This LFSR is said to be maximal in that it hits each output value exactly once when the registers are combined to form a three bit word. The only three bit value not hit is zero and if the LFSR were ever to be reset to a zero condition it could not escape without an external prompt. The order in which LFSR 80 progresses through all combinations of the three bit numbers is pseudo random in nature and LFSR are often used to generate pseudo random numbers or sequences. Not all feedback locations will result in the behavior described in Table I. If the feedback points are improperly chosen then either the LFSR will enter the zero state and become trapped or will repeat without covering all codes. There are tables readily available giving the feedback points for the most practical length LFSRs. For a sixteen bit LFSR shown in this preferred embodiment the feedback points are 1, 2, 4 and 15. For a thirty-two bit LFSR, they are 1, 5, 6 and 31. The larger the LFSR, that is the more stages it has, the less is the likelihood of aliasing. If an LFSR is reset and the same pattern of data is applied on two occasions then it will contain the same output on both occasions; if however, a different pattern is applied it may contain an identical value purely through chance and this is referred to as aliasing, a well known effect.

Other than generating random numbers the above arrangement is limited. If however, the LFSR is arranged to accept external inputs then its usefulness is much extended. This can be explained with respect to linear feedback shift register 80, FIG. 4, by providing an input such as MIN on line 91. Suppose then, for example, that the input on MIN line 91 is a 0; with a 0 constantly on line 91 the output reflected in Table I is unchanged, but suppose for example the output on MIN line 91 changed after three clocks (Table I) from a 0 to a 1, then the output in decimal would not be 2 but would be some other number, any of the other six numbers. This change in the pattern indicates that an error has occurred. And this so-called signature can be compared to an image signature made at the micro-controller 12 to alert the system that the data exchange contains an error. Since aliasing diminishes with increased register size it is desirable to use as large a linear feedback shift register as permissible. For example, using a sixteen-bit register provides only a 1 in 65,535 chance that the register will contain the correct data for an incorrect sequence, for a twenty-four-bit register the chances are 1 in 16 million. Linear feedback shift register 70 shown in more detail in FIG. 5 includes 16 stages, flip flop Q1, 100, flip flop Q2, 102 . . . flip flop Q16, 104, the feedback points are after stage 1 at 106, after stage 2 at 108 after stage 4 (not shown) and after stage 15, 110. These feedback points through their respective exclusive or gates 112, 114, 116 alter the pseudo random number sequence generated by linear feedback shift register 70 to create a signature of the data being exchanged between micro-controller 12 and data converter 14.

Although thus far the invention has been explained with respect to a linear feedback shift register servicing a serial bit stream this is not a necessary limit of the invention, for example if instead of a serial bit stream the data exchange occurred in bytes of 8 bits at a time a multiple signature input register (MISR) would be used.

Figure 7:
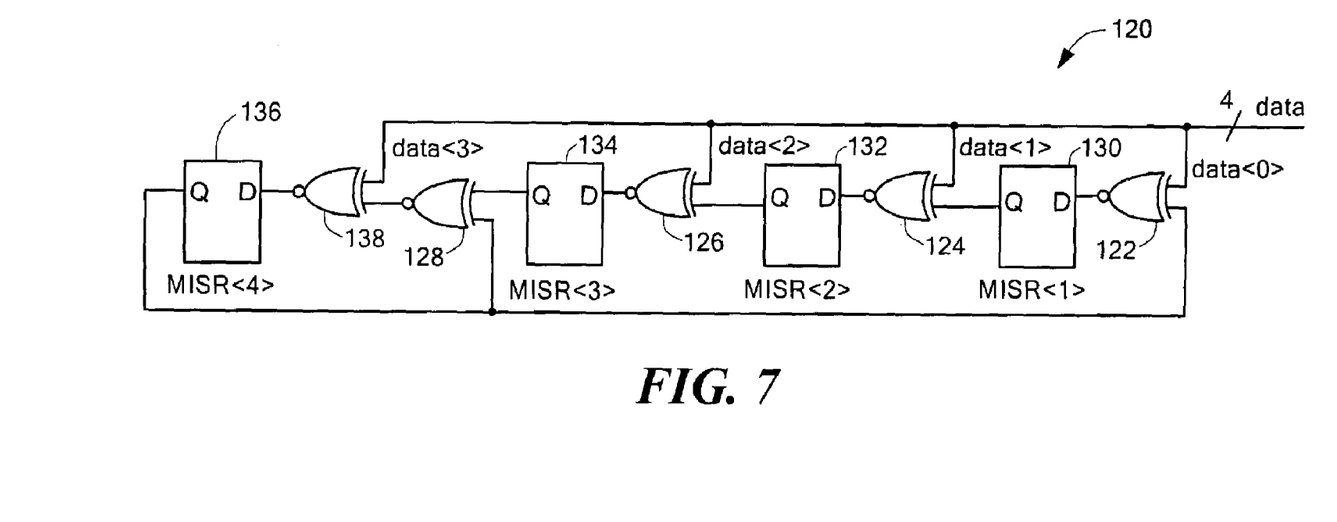
FIG. 7 is a schematic block diagram of a multiple signature input register which may be employed in the monitor circuit of FIG. 3.

Such an MISR 120 is shown in FIG. 7 for a multibit, four bit, data word which uses a logic gate, exclusive or gates 122, 124, 126 and 128 interposed between each flip flop stage 130, 132, 134, 136. Exclusive or gate 138 functions as before in the pseudo random number generation.

Figure 6:
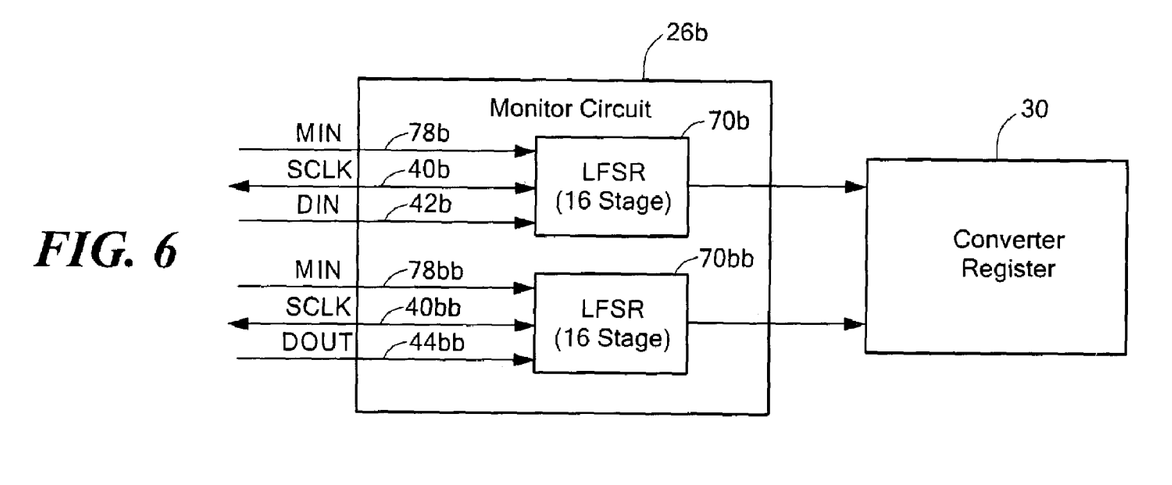
FIG. 6 is a more detailed schematic block diagram of a monitor circuit according to this invention for simultaneously processing data in and data out.

Although the description in FIG. 3 shows the data exchange occurring either with respect to the data input on DIN line 42 or the data output on DOUT line 44 under the control of mux 74 and the select signal on cell line 47, this is not a necessary limitation of the invention. For example, as shown in FIG. 6, monitor circuit 26b may include two linear feedback shift registers 70b and 70bb. Both registers receive monitor in signals on MIN lines 78b and 78bb and clock signals on SCLK line 40b and 40bb, however, register 70b receives only input data on DIN line 42b whereas register 70bb receives only data output on DOUT line 44bb, so that the signatures can be created for either or both data input and data output at the same time.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An interface error monitor system for monitoring data exchanged between a controller and a data converter over an interface comprising:
   a multistage linear feedback shift register associated with said data converter for generating a pseudo random number sequence;
   a signature generating circuit responsive to data exchanged between the controller and data converter for altering the pseudo random number sequence generated by said linear feedback shift register to create a signature of the data; and
   a replicating system associated with the controller and responsive to data exchanged for creating an image of the signature of the data created by said linear feedback shift register.

2. The interface error monitor system of claim 1 further including an error detecting system responsive to a mismatch between the signature of the data and the image of the signature of the data to indicate an error in the data exchange.

3. The interface error monitor system of claim 2 in which said error detecting system includes a comparator.

4. The interface error monitor system of claim 1 in which said linear feedback shift register includes at least sixteen stages.

5. The interface error monitor system of claim 1 in which said data exchange includes multibit words and said signature generating circuit includes a logic gate for each bit of a word in the data exchanged and each said logic gate is interposed between a different pair of stages.

6. The interface error monitor system of claim 1 in which said replicating system includes a second linear feedback shift register.

7. The interface error monitor system of claim 1 in which the data exchanged includes data in and data out.

8. The interface error monitor system of claim 7 further including a switching circuit for selectively connecting said linear feedback shift register to data in and data out.

9. The interface error monitor system of claim 8 includes said switching circuit in response to whether data in or data out is active.

10. The interface error monitor system of claim 7 further including a second linear feedback shift register associated with said data converter, one of said feedback registers being responsive to the data in and the other being responsive to the data out.

11. The interface error monitor system of claim 1 in which said data converter includes an analog to digital converter.

12. The interface error monitor system of claim 1 in which said data converter includes a digital to analog converter.

13. The interface error monitor system of claim 1 in which said linear feedback shift register can be reset by a sequence of bits in the data exchanged.

14. An interface error monitor system for monitoring data exchanged between a controller and a data converter over an interface comprising:
   a multistage linear feedback shift register associated with said data converter for generating a pseudo random number sequence;
   a signature generating circuit responsive to data exchanged between the controller and data converter for altering the pseudo random number sequence generated by said linear feedback shift register to create a signature of the data; and
   a replicating system associated with the controller and responsive to data exchanged for creating an image of the signature of the data created by said linear feedback shift register.

15. An interface error monitor system for monitoring data exchanged between a controller and a data converter over an interface comprising:
   a multistage linear feedback shift register associated with said data converter for generating a pseudo random number sequence;
   a signature generating circuit responsive to data exchanged between the controller and data converter for altering the pseudo random number sequence generated by said linear feedback shift register to create a signature of the data; said data exchange including a first data signal; and a serial clock for providing synchronizing clock signals between said controller and said data converter.

16. The interface error monitor system of claim 15 in which said data exchange further includes a second data signal.

17. The interface error monitor system of claim 15 further including a switching circuit for selectively connecting said linear feedback shift register to first and second data signals.

18. The interface error monitor system of claim 17 further including a second linear feedback shift register associated with said data converter, one of said feedback registers being responsive to said first data signal and the other being responsive to said second data signal.

19. An interface error monitor system for monitoring data exchanged between a controller and a data converter over an interface comprising:
 a multistage linear feedback shift register associated with said data converter for generating a pseudo random number sequence;
 a signature generating circuit responsive to data exchanged between the controller and data converter for altering the pseudo random number sequence generated by said linear feedback shift register to create a signature of the data; where the contents of the multistage linear feedback register is read from the data converter over the interface; and
 a replicating system associated with the controller and responsive to data exchanged for creating an image of the signature of the data created by said linear feedback shift register.

20. An interface error monitoring method for monitoring data exchanged between a controller and a data converter over an interface comprising:
 setting a signature in the data converter;
 setting a signature in the controller;
 altering, in response to data exchanged between the controller and data converter, the pseudo random number sequence generated by a linear feedback shift register in each of the data converter and controller to generate a new signature in each of the data converter and controller;
 communicating data between the controller and the data converter;
 reading the new signatures from the data converter and controller over the interface;
 comparing the new signatures from the data converter and controller; and
 validating the communication if the signatures match.

21. An interface error monitor system for monitoring data exchanged between a controller and a data converter over an interface comprising:
 a multistage linear feedback shift register associated with said data converter for generating a pseudo random number sequence;
 a signature generating circuit responsive to data exchanged between the controller and data converter for altering the pseudo random number sequence generated by said linear feedback shift register to create a signature of the data, said data exchanged including multibit words, said signature generating circuit including a logic gate for each bit of a word in the data exchanged and each said logic gate interposed between a different pair of stages.

22. An interface error monitor system for monitoring data exchanged between a controller and a data converter over an interface comprising:
 a multistage linear feedback shift register associated with said data converter for generating a pseudo random number sequence;
 a signature generating circuit responsive to data exchanged between the controller and data converter for altering the pseudo random number sequence generated by said linear feedback shift register to create a signature of the data and in which the data exchanged includes data in and data out; and
 a second linear feedback shift register associated with said data converter, one of said feedback registers being responsive to the data in and the other being responsive to the data out.

23. An interface error monitor system for monitoring data exchanged between a controller and a data converter over an interface comprising:
 a multistage linear feedback shift register associated with said data converter for generating a pseudo random number sequence, one of said feedback registers being responsive to a first data signal and the other being responsive to a second data signal;
 a signature generating circuit responsive to data exchanged between the controller and data converter for altering the pseudo random number sequence generated by said linear feedback shift register to create a signature of the data; said data exchange including a first data signal;
 a serial clock for providing synchronizing clock signals between said controller and said data converter; and
 a switching circuit for selectively connecting said linear feedback shift register to first and second data signals.

* * * * *